United States Patent [19]

Godshall et al.

[11] Patent Number: 5,198,716
[45] Date of Patent: Mar. 30, 1993

[54] MICRO-MACHINED RESONATOR

[75] Inventors: Ned A. Godshall; Dale R. Koehler; Alan Y. Liang; Bradley K. Smith, all of Albuquerque, N. Mex.

[73] Assignee: The United States of America as represented by the United States Department of Energy, Washington, D.C.

[21] Appl. No.: 803,815

[22] Filed: Dec. 9, 1991

[51] Int. Cl.⁵ .............................................. H01L 41/08
[52] U.S. Cl. ................... 310/349; 310/346; 310/344; 310/353; 310/361
[58] Field of Search ............... 310/328, 361, 346, 349, 310/353, 344, 343, 348, 320

[56] References Cited

U.S. PATENT DOCUMENTS

| | | | |
|---|---|---|---|
| Re. 26,707 | 11/1969 | Cutler et al. | 310/346 |
| 2,002,167 | 5/1935 | Bechmann | 171/327 |
| 2,161,980 | 6/1939 | Runge et al. | 171/327 |
| 2,677,775 | 5/1954 | Font | 310/344 |
| 2,699,508 | 1/1955 | Fastenau, Jr. | 310/9.4 |
| 3,931,388 | 1/1976 | Hafner et al. | 310/353 X |
| 3,988,621 | 10/1976 | Nakayama et al. | 310/9.4 |
| 4,135,108 | 1/1979 | Besson | 310/344 |
| 4,216,402 | 8/1980 | Engdahl | 310/353 X |
| 4,234,811 | 11/1980 | Hishida et al. | 310/348 |
| 4,334,168 | 6/1982 | Besson et al. | 310/343 |
| 4,362,961 | 12/1982 | Gerber | 310/370 |
| 4,393,131 | 7/1983 | Whalin et al. | 430/320 |
| 4,445,256 | 5/1984 | Huguenin et al. | 29/25.35 |
| 4,471,259 | 9/1984 | Stoermer et al. | 310/353 |
| 4,639,632 | 1/1987 | Nakata et al. | 310/353 |
| 4,651,042 | 3/1987 | Nakamura et al. | 310/321 |
| 4,764,244 | 8/1988 | Chitty et al. | 156/630 |
| 4,831,304 | 5/1989 | Dorey et al. | 310/311 |
| 4,906,840 | 3/1990 | Zdeblick et al. | 310/328 X |

OTHER PUBLICATIONS

K. Petersen, "Silicon as a Mechanical Material," *Proceedings of the IEEE*. vol. 70, No. 5, May 1982, pp. 420-457.

Primary Examiner—Mark O. Budd
Attorney, Agent, or Firm—Karla Ojanen; James H. Chafin; William R. Moser

[57] ABSTRACT

A micro-machined resonator, typically quartz, with upper and lower micro-machinable support members, or covers, having etched wells which may be lined with conductive electrode material, between the support members is a quartz resonator having an energy trapping quartz mesa capacitively coupled to the electrode through a diaphragm; the quartz resonator is supported by either micro-machined cantilever springs or by thin layers extending over the surfaces of the support. If the diaphragm is rigid, clock applications are available, and if the diaphragm is resilient, then transducer applications can be achieved. Either the thin support layers or the conductive electrode material can be integral with the diaphragm. In any event, the covers are bonded to form a hermetic seal and the interior volume may be filled with a gas or may be evacuated. In addition, one or both of the covers may include oscillator and interface circuitry for the resonator.

26 Claims, 5 Drawing Sheets

MICRO-MACHINED RESONATOR

The United States Government has rights in this invention pursuant to Contract No. DE-AC04-76DP00789 between the U.S. Department of Energy and American Telephone and Telegraph Company.

BACKGROUND OF THE INVENTION

The present invention relates to a quartz resonator and its support structure and more particularly to a hermetically sealed quartz resonator having a micro-machined support structure.

Quartz resonators are used for oscillators or sensing devices. In particular, a quartz resonator can be used as an oscillator for a watch or any other application which requires small size, low cost, and ruggedness. The quaratz resonator might also be used for microporcessor applications. A quartz resonator operates by resonating in response to a stimulus, which may be a physical event, such as acceleration or force or pressure, or an electrical signal. In the former usage, the resonator acts as a transducer, and in the latter case the resonator acts as a frequency source.

Previous technology for resonator support structures is varied and includes features which minimize the effects tending to restrict motion of the resonating surface resulting from physically holding the vibrating resonator body. To this end, the support is usually placed at a vibrational node of the resonator body. With discs operating in radial extension modes, attachment at the center of the disc is a conventional technique for support.

For shear mode type resonators with little vibrational motion normal to the plane of the resonator, conventional support techniques have included various elastic clamping means at the periphery of the resonator where relative shear-motion quiescence occurs. These clamps have conventionally been wires, metallic ribbons, metallic springs, etc. Another conventional support technique has been to fashion the resonator and the resonator support from a single piece of quartz by chemical or mechanical machining methods.

U.S. Pat. No. 4,362,961 to Gerber discloses an encapsulated piezoelectric resonator device wherein a vibrating member and a frame member are formed integrally on a single substrate. The frame/resonator member is sandwiched between and bonded to two cover members which are positioned above and below the resonator member, respectively. The resonator member is connected to a number of electrodes and connection to the electrodes is provided by passages through the two cover members. This resonator operates in a flexure mode. The resonator member and the cover members are rigidly fixed together.

U.S. Pat. No. 4,234,811 to Hishida et al. discloses a supporting structure for a thickness-shear type crystal oscillator for watches wherein the supporting structure of a resonator element has a pair of flexible tongues to support the resonator element from both the top and the bottom of the resonator element. Additionally, another set of tongues is provided to engage notches on the resonator element's periphery to prevent lateral motion.

U.S. Pat. No. 4,988,621 to Nakayama et al. discloses an insulating ring with projections for supporting and rigidly clamping a quartz resonator. Electrodes are placed directly onto the shear-mode resonator and small wires electrically connect the electrodes to the insulating ring.

U.S. Pat. No. 2,002,167 to Beckmann discloses a crystal quartz resonator wherein capacitive coupling is used to excite the resonator. A support for the resonator is disclosed which uses notches and pins on the edge of the resonator.

U.S. Pat. No. 2,161,980 to Runge et al. discloses an elastically oscillating oscillator which uses a "wave reflection" phenomenon to produce a superior support structure for a vibrating member. A capacitively coupled drive structure in an evacuated enclosure to reduce deleterious air damping is disclosed.

U.S. Pat. No. 4,445,256 to Huguenin et al. discloses a method for manufacturing piezoelectric resonator components wherein the resonator is produced using "wafer level assembly" wherein a multiplicity of resonators are formed on a large quartz wafer. This quartz wafer has been welded to a top and bottom cover which are ceramic or glass.

U.S. Pat. No. 4,764,244 to Chitty et al. and 4,831,304 to Dorey et al. disclose a method of making a resonator, such as a sensor, which uses micro-machining technology.

SUMMARY OF THE INVENTION

It is an object of the present invention to provide a quartz resonator which has a micro-machined support structure.

It is another object of the present invention to provide a micro-machined support structure for a resonator which includes cantilever springs which support the resonator.

It is another object of the present invention to provide a micro-machined support structure for a resonator which allows micron thick air gaps to be formed.

It is another object of the present invention to provide a micro-machined support structure for a resonator which uses capacitive coupling and external electrodes.

It is yet a further object of the present invention to provide a micro-machined support structure for a resonator which operates in a thickness-shear mode.

It is yet another object of the present invention to provide a micro-machined support structure for a resonator which has oscillator circuitry and interface circuitry integrally formed within the top or bottom cover.

It is yet another object of the present invention to provide a micro-machined support structure for a resonator which forms a hermetic enclosure thus increasing air damping qualities.

The present invention is a micro-machined support structure for a quartz resonator which includes an upper and lower support member, a spacer ring which creates a hermetically sealed volume between the upper and lower support members, and a resonator, having an energy trapping quartz mesa, which may be supported by micro-machined cantilever springs. The resonator is capacitively coupled to external electrodes. In addition, the upper or lower support member includes oscillator and interface circuitry.

BRIEF DESCRIPTION OF THE DRAWINGS

These and other objects, features and advantages of this invention will become more clear from the following detailed description of the preferred embodiment when considered connected to the accompanying drawings, wherein like parts in each of the figures are identified by like reference numerals, and wherein.

DETAILED DESCRIPTION OF THE INVENTION

Figure 1:
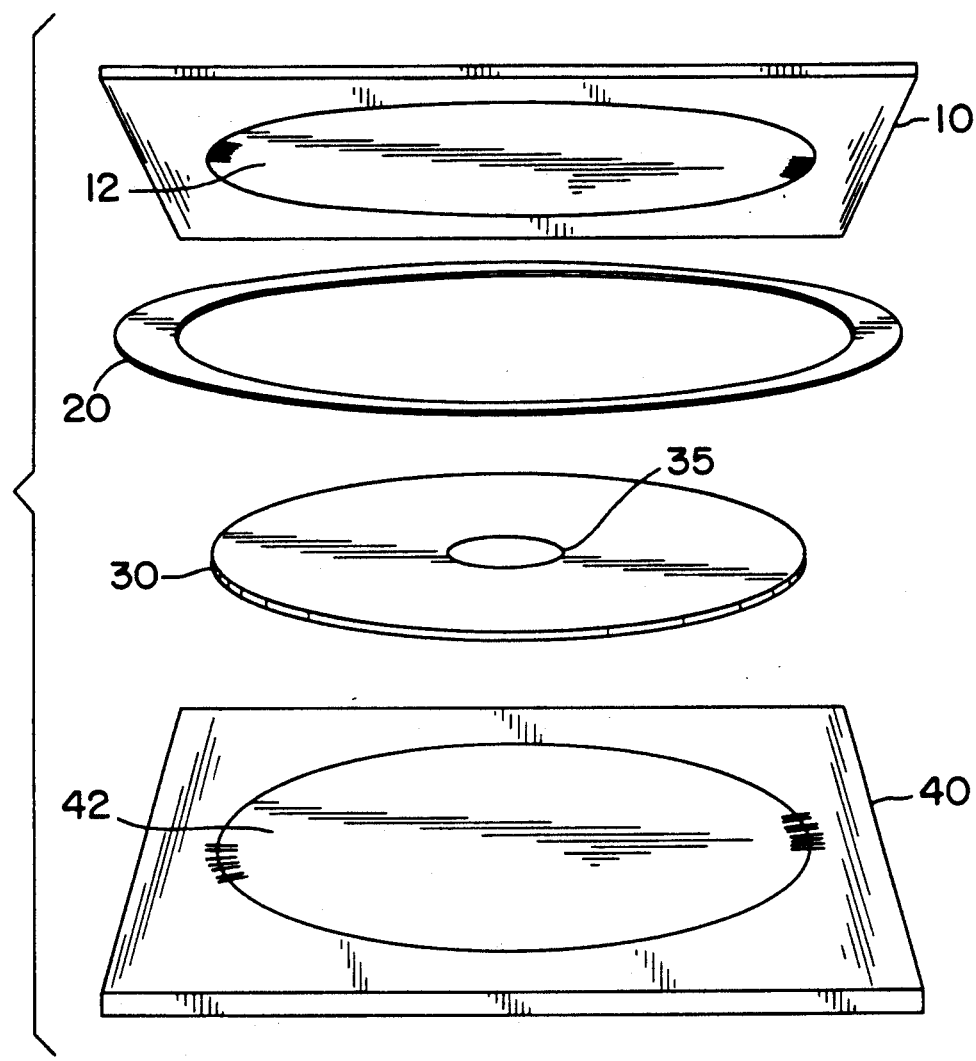
FIG. 1 is a perspective view of a micro-machined support structure for a quartz resonator.

Now, with reference to the Figures, the preferred embodiments of the present invention will now be described. With reference to FIG. 1, a three-dimensional view of a support structure for a quartz resonator of the present invention is shown. An upper support member 10 has an inner circular cut-out etched well area 12 into which a quartz resonator 30 fits. A spacer 20 fits around the periphery of the resonator 30 to provide additional space between the upper support member 10 and a lower support member 40. Alternatively, the spacer 20 and the quartz resonator 30 may be integrally fabricated from one piece of quartz. The upper and lower support members 10, 40 have been described as manufactured from silicon; however, other micromachinable materials such as glass, quartz and gallium arsenide may be used to fabricate the support members 10, 40. The lower support member 40 also has an inner cut-out etched well area 42 which accommodates the resonator 30 as well. The resonator 30 has an etched quartz mesa 35 which traps energy into the resonator 30 and makes the resonator 30 less sensitive to external perturbations at the resonator's periphery.

Figure 2:
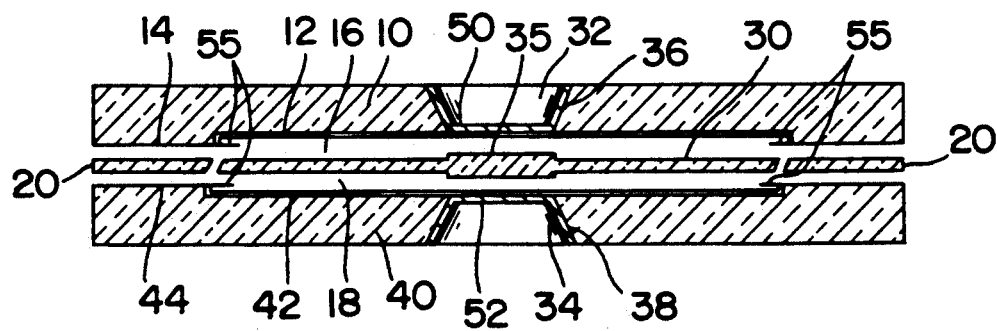
FIG. 2 is a side view of the micro-machined support structure for a quartz resonator of FIG. 1.

Now, with reference to FIG. 2, a side view of the support structure for a quartz resonator of FIG. 1 will be described. The upper support member 10 and the lower support member 40 are shown separated to facilitate understanding although the actual support structure is completely bonded together. The mesa 35 is located at the center of the resonator 30. The spacer 20 is located around the periphery of the resonator 30 and provides support to the resonator 30. The upper support member 10 is etched above the resonator 30 to form an upper well 32 whose walls and bottom are defined by an electrically active metallic layer, preferably aluminum, to form an upper electrode 36. A thin layer 50, which may be silicon dioxide or silicon nitride, lines the circular inner cut-out etched portion 12 of the upper support member 10 and extends across and is interposed between the upper electrode 36 and upper space 16. Similarly, a thin layer 52 lines the circular inner cut-out etched portion 42 of the lower support member 40 and extends across and is interposed between the lower electrode 38 and lower space 18. Upper and lower electrodes 36, 38 are both connected to the same driving oscillator circuit (not shown).

Figure 3:
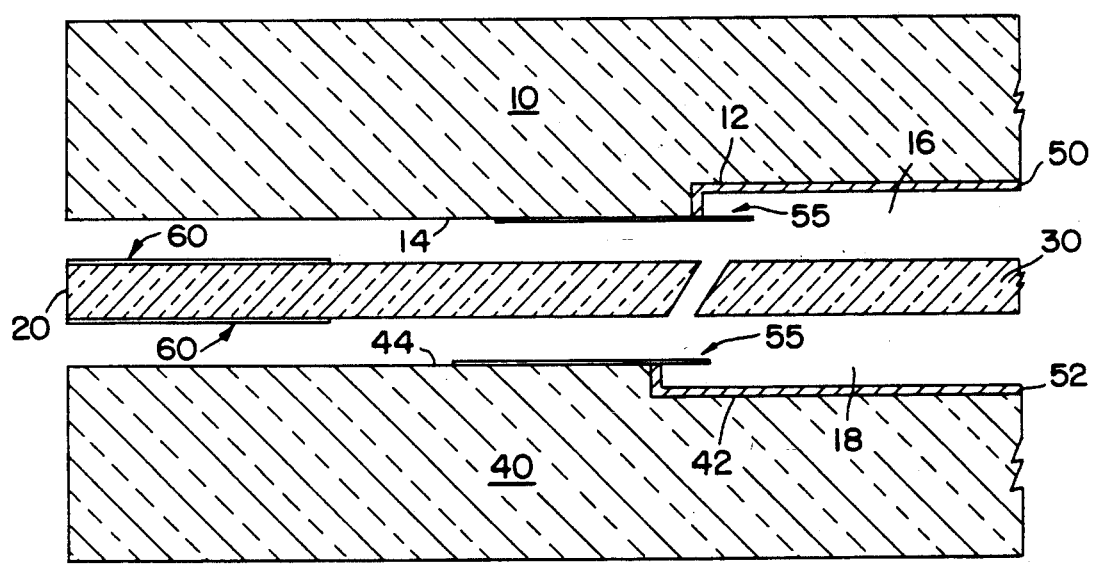
FIG. 3 is a more detailed view of the edge of the micro-machined support structure for a quartz resonator of FIG. 2.

Now, with reference to FIG. 3, a more detailed side view of the edge of the support structure of FIG. 2 will be described. The upper support member 10 and the lower support member 40 are shown. The circular inner cut-out etched portion 12 of the upper support member and the inner cut-out etched portion 42 of the lower support member, if fabricated from silicon, are coated with layers 50, 52 of silicon dioxide or silicon nitride. Layers 50, 52 provide an etch stop feature for electrode diaphragm fabrication and function as the diaphragm. The characteristics of the diaphragm layer 50, 52 which constitute the bottom or top layer of the etched upper and lower wells 32, 34, respectively, can be controlled. Precise frequency or clock applications are available if the layers 50, 52 are rigid. If, however, layers 50, 52 are flexible and sensitive to pressure or external forces, the invention herein may be used for transducer or sensor applications. The upper and lower support members 10, 40 may also each have a cantilever spring 55 which is deposited on an outer portion 14, 44 of the support member. The cantilever springs 55 overhang the cut-out portion 12, 42 of the support members. The cantilever springs 55 are deposited by and may be made of silicon dioxide, silicon nitride, or single crystal silicon. These cantilever springs 55 support the resonator 30 and allow it to be supported without any actual physical connection to the resonator 30 which would increase the sensitivity of the resonator 30 to external forces. Thus, the resonator 30 rests between the cantilever springs 55.

Once the support structure for the quartz resonator is bonded together, the upper and lower support members 10, 40 sandwich the spacer ring 20 and the resonator 30 in between them. To aid in this bonding, a layer 60 of preferably PYREX ® is first deposited on the surfaces of spacer ring 20 and subsequently is field assisted bonded to the edge of the support member surfaces 14, 44. This layer 60 is preferably as thick as the cantilever springs 55 so that when the spacer ring 20 is bonded between upper and lower support members 10, 40, there is no free space between the two support members 10, 40 and the spacer 20. This provides a hermetic seal so that the enclosed area may be filled with a gas which improves the performance of the quartz resonator 30 by providing squeeze-film damping for shock and vibration absorption. Alternately, the hermetic seal may create an evacuated enclosure.

Referring back to FIG. 2, capacitive coupling is achieved by virtue of the air gaps 16, 18 or any dielectric material between the resonator surface 35 and the upper and lower electrodes 36, 38. Although reference is made to the air gap 16, 18, the space may be filled with an inert gas or may be a vacuum, and other intervening dielectric material. Although the upper and lower support structures 10, 40 are configured to provide insulating layers 50, 52, which may be silicon, as an intervening material, the support structures could be configured with no material between conducting electrodes 36, 38 and air-gaps 16, 18 respectively. In the case which includes a dielectric layer, the capacitor is a composite of dielectric and air while in the case which includes no dielectric the capacitor is solely an air-gap capacitor.

The electrical effect of capacitive coupling is to present a reactive load, i.e., the coupling capacitor, in series with the quartz resonator 30 which in turn affects the mechanical motion of the resonator 30. The larger the value of the series capacitor the smaller will be the reactive impedance and the smaller will be its influence on the vibrating resonator. The primary effect is to shift the frequency of resonance or operation and a secondary effect is to reduce the driving efficiency. Should the coupling capacitor become too small which may be associated with large air gaps, resonator excitation becomes impossible. Because the coupling capacitor depends on the thickness of the air-gap, any variation of this thickness will cause an associated operating frequency change; at most this frequency change is of the order of hundreds to thousands of parts per million. As discussed earlier, the characteristics of the diaphragm layers 50, 52 can also be controlled to determine the function of the invention.

Figure 4:
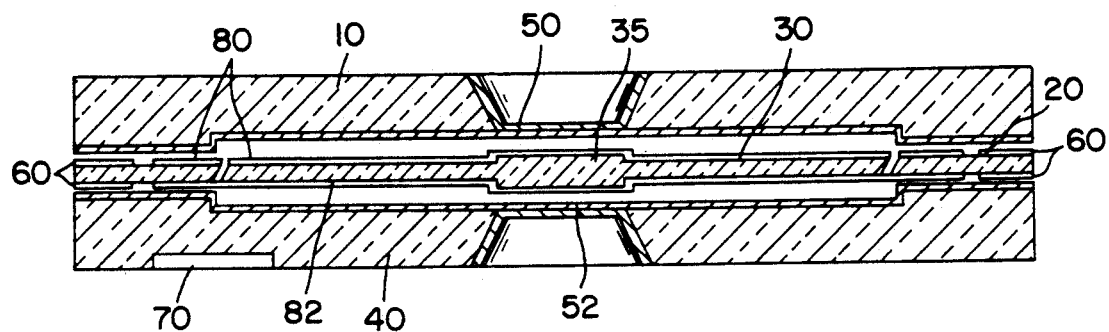
FIG. 4 is a side view of a support structure for a quartz resonator which is one preferred embodiment of the present invention.
Figure 5:
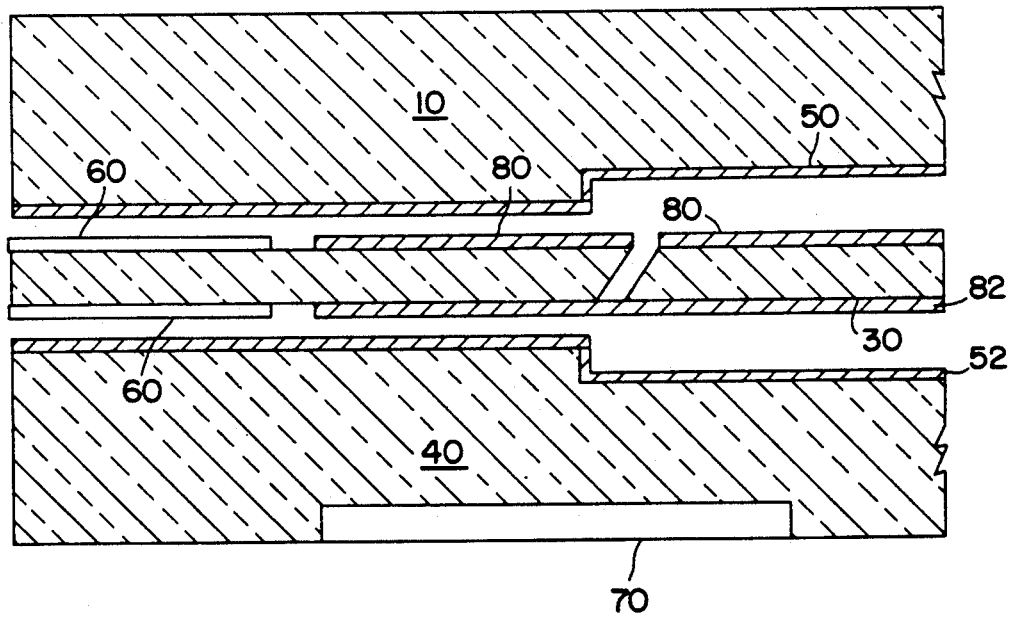
FIG. 5 is a more detailed side view of the edge of the support structure of FIG. 4.

Now, with reference to FIGS. 4 and 5, another support structure for the quartz resonator will be described in accordance with another embodiment of the present invention. The resonator 30 in this embodiment also has the etched quartz mesa 35 as in the previous embodiment, but has a different type of support structure. Also, this embodiment includes oscillator and interface circuitry 70 integrally formed within the lower support member 40.

In this embodiment, layers 50, 52, which may be silicon dioxide or silicon nitride, are deposited over the entire surface of the upper support member 10 and the lower support member 40, respectively. A layer 80, which may also be silicon nitride, is deposited on top of the quartz resonator 30 and a certain predetermined distance on the spacer ring 20. On the bottom of the quartz resonator 30, a layer 82, of silicon nitride, extends from the resonator 30 across the gap between the resonator and spacer ring 20 to a certain point on the spacer ring. The upper layer 80 has a gap in it corresponding to the gap between the resonator 30 and the spacer ring 20. The lower layer 82 provides support for the resonator 30 as the cantilever springs 55 did in the previous embodiment.

In order to ensure a hermetic seal between the upper support member 10 and the lower support member 40 and the spacer ring 20 which is sandwiched between them, a layer 60, which may be PYREX ®, which has the same thickness as the layers 80, 82 is deposited on the edge portion of the spacer ring 20. Thus, when the entire structure is bonded together, no air gaps exist between the upper and lower support members 10, 40 and the spacer ring 20.

Figure 6:
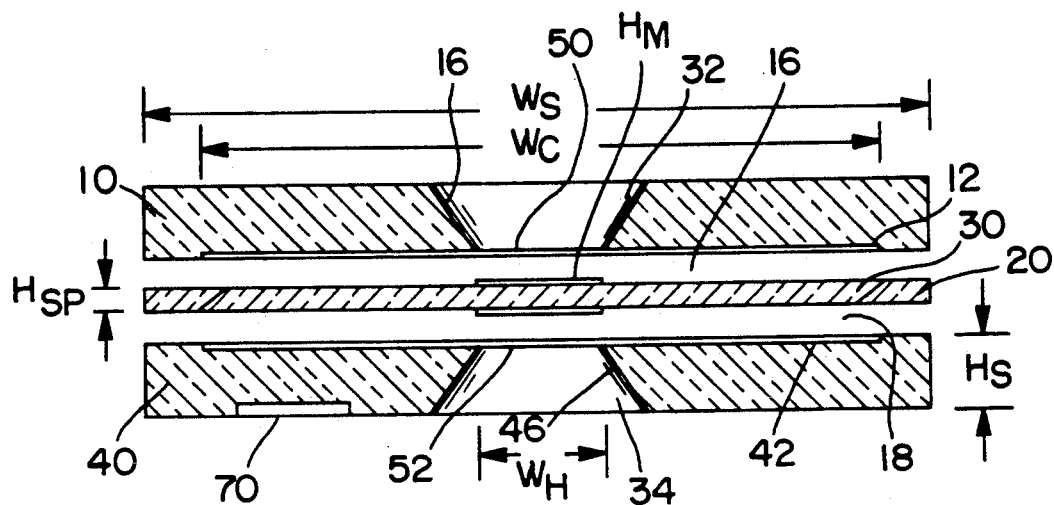
FIG. 6 is a side view of a support structure for quartz resonator in accordance with another embodiment of the present invention.
Figure 7:
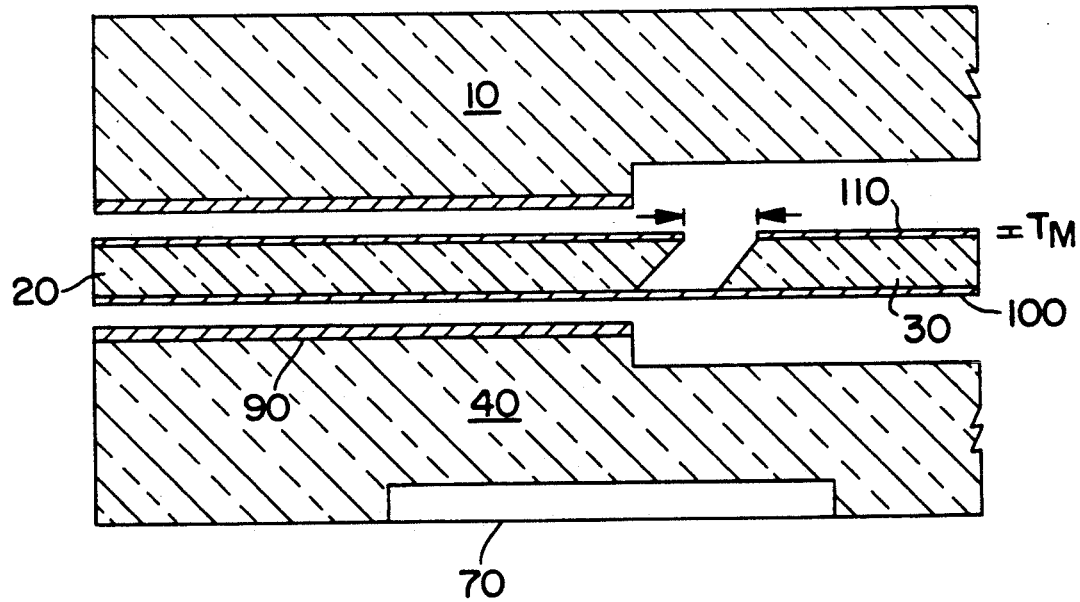
FIG. 7 is a more detailed side view of the edge of the support structure of FIG. 6.

Now, with reference to FIGS. 6 and 7, another support structure for a quartz resonator in accordance with another embodiment of the present invention will be described. FIGS. 6 and 7 show a quartz resonator which has a quartz spacer 20. FIGS. 6 and 7 additionally show the dimensions of a exemplary quartz resonator and its support structure of the present invention. Both the upper support member 10 and the lower support member 40 have a height denoted by $H_s$, which usually is typical of commercially available substrate. Commercially available silicon typically has a thickness on the order of 250 microns. The critical dimension which determines the frequency of the vibrating quartz resonator is the sum of the height labeled $H_{sp}$, which is the height of the spacer 20 or resonator 30, both of which have a combined height labeled $H_{sp}$, and twice the height of mesa 35, $H_m$, in the center of the resonator 30. The frequency of the resonator is also influenced by the size of the air gaps 16, 18. To achieve quality resonance the lateral extent of the resonating region or the width, denoted by $W_h$, is optimized according to the thickness of the resonator, $H_{sp}+2H_m$, based on energy trapping principles. FIG. 6 illustrates this dimension as the bottom of the upper well 32 and the top of the lower well 34. The cut-out portions 12, 42 of the upper and lower support members 10, 40 have a width $W_c$ which is dependent upon $W_h$; and the upper and lower support members 10, 40 have a width $W_s$ dependent upon $W_c$.

Now, with reference to FIG. 7, an edge view of the quartz resonator structrue of FIG. 6 will be described. FIG. 7 shows the support structure for the resonator 30 and the spacer 20. In order to provide a hermetic enclosure for the resonator 30 and the spacer 20, a bond layer 90 is deposited on the outer portion 14, 44 of the support members and bonds the upper support member 10 and the lower support member 40 to the spacer 20. The top portion of the spacer 20 and the resonator 30 has an etch mask layer 110 deposited on top. There is a small gap in this mask 110 between the resonator 30 and the spacer 20. To support the resonator 30, a film layer 100 which may be silicon is deposited along the bottom of the resonator 30 and across the gap and onto the bottom of the spacer 20. This provides the support for the resonator 30 which was previously supplied by the cantilever springs 55.

Figure 8:
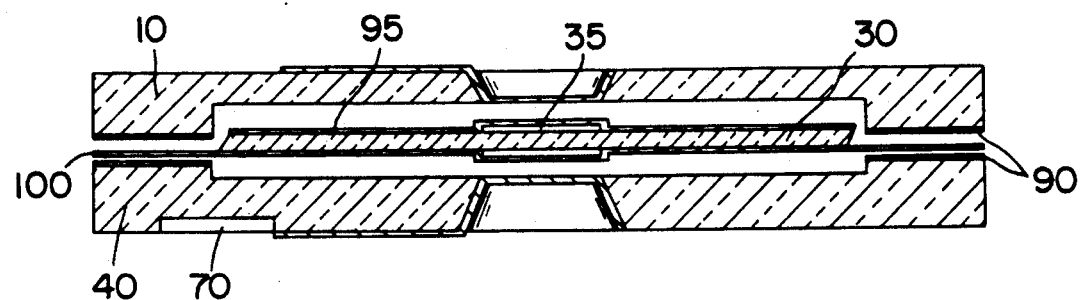
FIG. 8 is a side view of another support structure of a quartz resonator in accordance with another embodiment of the present invention.
Figure 9:
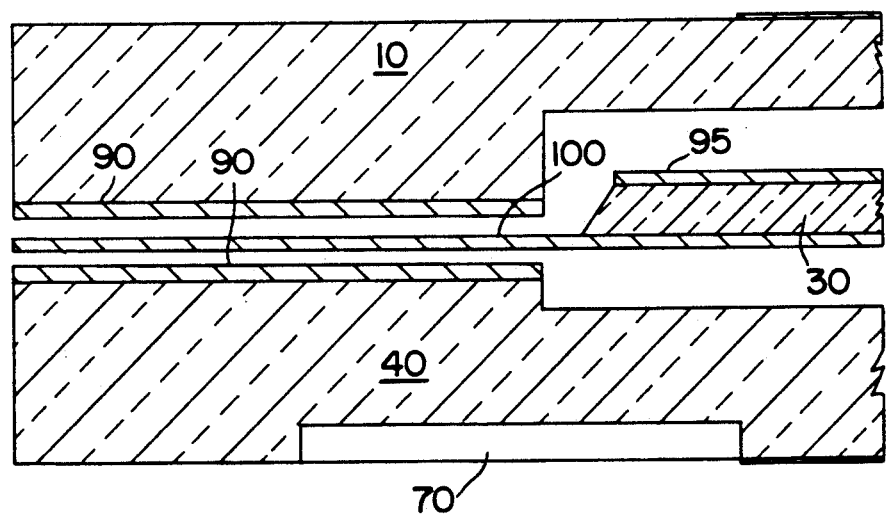
FIG. 9 is a more detailed side view of the edge of the support structure shown in FIG. 8.

Now, with reference to FIGS. 8 and 9, another embodiment of the present invention will be described wherein an integral spacer is used to support the resonator 30. In this embodiment, a bond layer 90 is coated onto the upper and lower support members 10 and 40. The oscillator and interface circuitry 70 is still present on the lower support member 40. The top of the resonator 30 is coated with a layer 95, which may be silicon. The lower surface of the resonator 30 is coated with another layer 100 which may be silicon and extends beyond the resonator to between the upper support member 10 and lower support member 40. Thus, the layer 100 is bonded between the upper support member 10 and the lower support member 40 by the bond layers 90 to provide a structure for supporting the resonator 30.

Although a number of preferred embodiments of the present invention have been shown in the drawings and described, the preferred embodiments are intended to be illustrative and not limiting. Many modifications and changes to the present invention can be made without departing from the spirit or scope of the following claims.

What is claimed is:

1. A micro-machined resonator, comprising:
   (a) an upper micro-machinable support member having an upper well connected to an upper electrode means;
   (b) a lower micro-machinable support member having a lower well connected to a lower electrode means, said lower support member opposing said upper support member;
   (c) a resonator capacitively coupled to said electrodes, said resonator having a centrally located energy trapping quartz mesa and supported between said upper well of said upper support member and said lower well of said lower support member;
   (d) an upper diaphragm interposed between said upper well and said resonator;
   (e) a lower diaphragm interposed between said lower well and said resonator;

(f) spacer means for defining a volume between said micro-machinable support members and said resonator; and (g) support means for supporting said resonator in said volume.

2. The resonator of claim 1, wherein said micro-machinable support members are fabricated from a group including silicon, glass, quartz, and gallium arsenide.

3. The resonator of claim 1, wherein said upper micro-machinable support member and said lower micro-machinable support member are bonded together to create a hermetic seal.

4. The resonator of claim 3, wherein said support members are coated with a material to facilitate electric field assisted bonding.

5. The resonator of claim 3, wherein said volume between said micro-machinable support members and said resonator is filled with a gas.

6. The resonator of claim 3, wherein said volume between said micro-machinable support members and said resonator is a vacuum.

7. The resonator of claim 2, wherein said upper and lower diaphragms are resilient.

8. The resonator of claim 2, wherein said upper and lower diaphragms are rigid.

9. The resonator of claim 2, wherein said electrodes further comprise an upper conductive layer in contact with said upper well and a lower conductive layer in contact with said lower well.

10. The resonator of claim 9, wherein said electrodes and said diaphragms are integral.

11. The resonator of claim 2, wherein said spacer means is a spacer ring circumscribing said resonator placed between said upper and lower micro-machinable support members.

12. The resonator of claim 11, wherein said spacer means and said resonator are integral and fabricated from quartz.

13. The resonator of claim 2, wherein at least one of said micro-machinable support members comprises circuit means integrated into said micro-machinable support member for controlling and receiving electrical signals generated by said resonator sent through said electrodes.

14. The resonator of claim 13, wherein said circuit means further comprises oscillator and interface circuitry.

15. The resonator of claim 2, wherein said support means are cantilever spring means attached to said upper and lower micro-machinable support members.

16. The resonator of claim 15, wherein said cantilever springs means are fabricated from silicon dioxide.

17. The resonator of claim 15, wherein said cantilever springs means are fabricated from silicon nitride.

18. The resonator of claim 2, wherein said support means are membrane layers on said support members toward said resonator, said membrane layers support said mesa of said resonator, and said membrane layers are fabricated from one of the group consisting of silicon, silicon dioxide, or silicon nitride.

19. A micro-machined quartz resonator comprising:
(a) an upper micro-machinable support member having an upper coated etched portion and an upper outer portion circumscribing said upper coated etched portion;
(b) a lower micro-machinable support member having a lower coated etched portion and a lower outer portion circumscribing said lower coated etched portion;
(c) a quartz resonator having a centrally located energy trapping quartz mesa, said resonator being located between said upper and lower micro-machinable support members in a volume defined by said upper and lower etched portions;
(d) cantilever spring means for supporting said resonator in said volume between said micro-machinable support members for supporting said quartz resonator wherein said cantilever spring means are located on said outer portions of said upper and lower micro-machinable support members and extending over said etched portions of said upper and lower micro-machinable support members and wherein said cantilever spring means are not physically bonded or otherwise rigidly attached to said resonator; and
(e) spacer means, located adjacent to said quartz resonator and between said upper and lower micro-machinable support members and having a coating for forming a hermetic seal between said upper micro-machinable support and said lower micro-machinable support member.

20. A micro-machined quartz resonator comprising:
(a) an upper micro-machinable support member having an upper coated etched portion and an upper outer portion circumscribing said upper coated etched portion;
(b) a lower micro-machinable support member having a lower coated etched portion and a lower outer portion circumscribing said lower coated etched portion;
(c) a quartz resonator having a centrally located energy trapping quartz mesa, said resonator being located between said upper and lower micro-machinable support members in a volume defined by said upper and lower etched portions;
(d) cantilever spring means for supporting said resonator in said volume between said micro-machinable support members for supporting said quartz resonator wherein said cantilever spring means are located on said outer portions of said upper and lower micro-machinable support members and extending over said etched portions of said upper and lower micro-machinable support members, said cantilever springs means are fabricated from one of the group consisting of silicon dioxide, silicon nitride, and single crystal silicon; and
(e) spacer means, located adjacent to said quartz resonator and between said upper and lower micro-machinable support members and having a coating for forming a hermetic seal between said upper micro-machinable support and said lower micro-machinable support member.

21. The resonator of claim 20, wherein said bond layer on said upper support member extends across said upper etched portion, and said bond layer on said lower support member extends across said lower support member, and said bond layer and said diaphragm are integral.

22. The resonator of claim 20, wherein said bond layer on said upper support member extends to said upper etched portion, and said bond layer on said lower support member extends to said lower etched portion, and said conductive layer and said diaphragm are integral.

23. The resonator of claim 20, wherein said diaphragms are rigid.

24. The resonator of claim 20, wherein said diaphragms are resilient.

25. A micro-machined resonator comprising:
   (a) an upper micro-machinable support member having an upper etched portion and an upper outer portion, said upper etched portion lined with a conductive layer to form an upper electrode;
   (b) a lower micro-machinable support member having a lower coated etched portion and a lower outer portion, said lower etched portion lined with a conductive layer to form a lower electrode;
   (c) a support bond layer deposited on said upper outer portion and said lower outer portion for forming a hermetic seal between said upper micro-machinable support member and said lower micro-machinable support member;
   (d) a resonator capacitively coupled to said electrodes, said resonator having a centrally located energy trapping quartz mesa, and situated between said upper and lower micro-machinable support members in a volume defined by said upper and lower etched portions, said resonator supported by said support bond layer;
   (e) spacer means, circumscribing said quartz resonator and situated between said upper and lower micro-machinable support members to suspend said resonator in said volume; and
   (f) an upper diaphragm between said upper electrode and said resonator;
   (g) a lower diaphragm between said lower electrode and said resonator; and
   (h) circuit means integrated into at least one of said micro-machinable support members for controlling and receiving electrical signals generated by said resonator sent through said electrodes.

26. A micro-machined quartz resonator comprising:
   (a) an upper micro-machinable support member having an upper coated etched portion and an upper outer portion circumscribing said upper coated etched portion wherein said upper coated etched portion is coated with a layer fabricated from one of the group consisting of silicon dioxide or silicon nitride;
   (b) a lower micro-machinable support member having a lower coated etched portion and a lower outer portion circumscribing said lower coated etched portion wherein said lower coated etched portion is coated with a layer fabricated from one of the group consisting of silicon dioxide or silicon nitride;
   (c) a quartz resonator having a centrally located energy trapping quartz mesa, said resonator being located between said upper and lower micro-machinable support members in a volume defined by said upper and lower etched portions;
   (d) support means for supporting said resonator in said volume between said micro-machinable support members for supporting said quartz resonator; and
   (e) spacer means, located adjacent to said quartz resonator and between said upper and lower micro-machinable support members and having a coating for forming a hermetic seal between said upper micro-machinable support and said lower micro-machinable support member.

* * * * *